United States Patent [19]

Morita

[11] Patent Number: 4,677,311

[45] Date of Patent: Jun. 30, 1987

[54] POWER SUPPLY SYSTEM FOR AN ELECTRONIC APPARATUS HAVING MEMORY

[75] Inventor: Kazuo Morita, Hadano, Japan

[73] Assignee: Hitachi, Ltd., Tokyo, Japan

[21] Appl. No.: 813,155

[22] Filed: Dec. 24, 1985

[30] Foreign Application Priority Data

Dec. 29, 1984 [JP] Japan .................. 59-279658

[51] Int. Cl.⁴ .............................................. H02J 9/06
[52] U.S. Cl. ......................................... 307/66; 307/64;
307/87; 328/258; 361/90
[58] Field of Search ........................ 307/64, 66, 43, 44,
307/45, 46, 48, 65, 85, 86, 87, 51; 361/90, 91,
92, 93, 89, 86, 88; 328/258, 259, 260;
364/431.11, 431.12

[56] References Cited

U.S. PATENT DOCUMENTS

| | | | |
|---|---|---|---|
| 3,614,461 | 10/1971 | Speer | 307/64 |
| 3,723,855 | 3/1973 | Shuleshko | 307/85 X |
| 3,778,634 | 12/1973 | Hanrihan | 307/64 |
| 4,065,676 | 12/1977 | Elias | 307/87 |
| 4,087,697 | 5/1978 | Johnson | 307/66 |
| 4,195,233 | 3/1980 | Udvardi-Lakos | 307/66 |
| 4,262,214 | 4/1981 | Patel | 307/51 |
| 4,270,165 | 5/1981 | Carpenter et al. | 307/58 X |
| 4,323,788 | 4/1982 | Smith | 307/66 |
| 4,327,298 | 4/1982 | Burgin | 307/66 |
| 4,340,823 | 7/1982 | Miyazawa | 307/66 |
| 4,388,706 | 6/1983 | Butler | 307/64 X |
| 4,426,587 | 1/1984 | Nouet | 307/66 |
| 4,441,031 | 4/1984 | Moriya et al. | 307/66 |
| 4,473,756 | 9/1984 | Brigden et al. | 307/66 |
| 4,475,047 | 10/1984 | Ebert | 307/66 |
| 4,528,459 | 7/1985 | Wiegel | 307/66 |
| 4,564,767 | 1/1986 | Charych | 307/48 X |
| 4,588,989 | 5/1986 | Yasuda et al. | 307/66 X |

Primary Examiner—William M. Shoop, Jr.
Assistant Examiner—Shik Luen Paul Ip
Attorney, Agent, or Firm—Antonelli, Terry & Wands

[57] ABSTRACT

A power supply system includes a main power unit for supplying power necessary for the operation of an electronic apparatus including a memory, an auxiliary power unit for supplying power necessary for retaining the memory contents, and a battery serving as a back-up of said main and auxiliary power units for supplying power necessary for retaining the memory contents. The memory is supplied with power from the main power unit when it is in the power-on state, from the auxiliary power unit when the main power unit is in the power-off state, and from the battery in the event of a.c. power failure.

8 Claims, 2 Drawing Figures

POWER SUPPLY SYSTEM FOR AN ELECTRONIC APPARATUS HAVING MEMORY

BACKGROUND OF THE INVENTION

This invention relates to a power supply system for an electronic apparatus incorporating a volatile memory and, particularly, to a power supply system suitable for use with a data processing system.

A conventional power supply circuit for a volatile memory is disclosed in Japanese Patent Unexamined Publication No. 57-23123. This prior art circuit arrangement is intended to automatically switch the supply of electric power from the main power supply to the battery in response to the turn-off operation of the main power supply. However, this system needs a battery of large capacity depending on the expected turn-off duration of the main a.c. power supply, since the battery is used continuously during the "power-off" state regardless of the presence or absence of the a.c. power input.

Another prior art technique disclosed in Japanese Patent Unexamined Publication No. 56-168246 is the use of a battery in response to the detection of a.c. power failure. However, this system operates in response to two conditions, i.e., the output voltage of a main power supply has built up or a.c. power failure exists, and there is no description in the publication on the "power-off" operation of the main power supply. Accordingly, when the main power supply is turned off, battery back-up is started as in the case of power failure, resulting in over-discharging of the battery.

Another technique similar to that of the above patent publication 56-168246 is discribed in Japanese Patent Unexamined Publication No. 59-24323. This publication does not describe the "power-off" operation of the main power unit and power failure and power-off can not be distinguished, resulting in over-discharging of the battery.

Still another technique disclosed in Japanese Patent Unexamined Publication No. 56-116134 is intended to operate such that the battery back-up for the volatile memory is suspended upon expiration of a certain time length after the state of power failure has been detected so as to prevent over-discharging of the battery. Also in this publication, no description is given for the power-off operation for the main power supply, and the system treats the power failure in the power-off state in the same way as the power failure in the power-on state, resulting in over-discharging of the battery.

SUMMARY OF THE INVENTION

An object of this invention is to prevent over-discharging of a back-up battery during the power-off state of the main power supply.

Another object of this invention is to prevent over-discharging of a back-up battery through the setup of different battery back-up time lengths for the power failure occuring in the power-on state and for the power failure occuring in the power-off state.

Generally, a memory device consumes a relatively large power when it is accessed, while it needs little power for holding information. In view of this property of memory devices, the present invention contemplates to supply power to the apparatus from a main power source during the power-on state in which power consumption is high due to memory access, from an auxiliary power source during the power-off state, i.e., standby mode, and from a battery only in the event of power failure. In consideration of the battery service life which is deteriorated by over-discharging, the battery back-up time is set longer for the case of occurrence of power failure during power-on state at which occurrence no time is available for evacuating important information to a non-volatile memory such as a floppy disk, and a shorter battery back-up time is set for the case of occurrence of power failure during power-off state in which power-off state important information has already evacuated, so that the over-discharging of the battery is prevented.

DESCRIPTION OF THE PREFERRED EMBODIMENT

Figure 1:
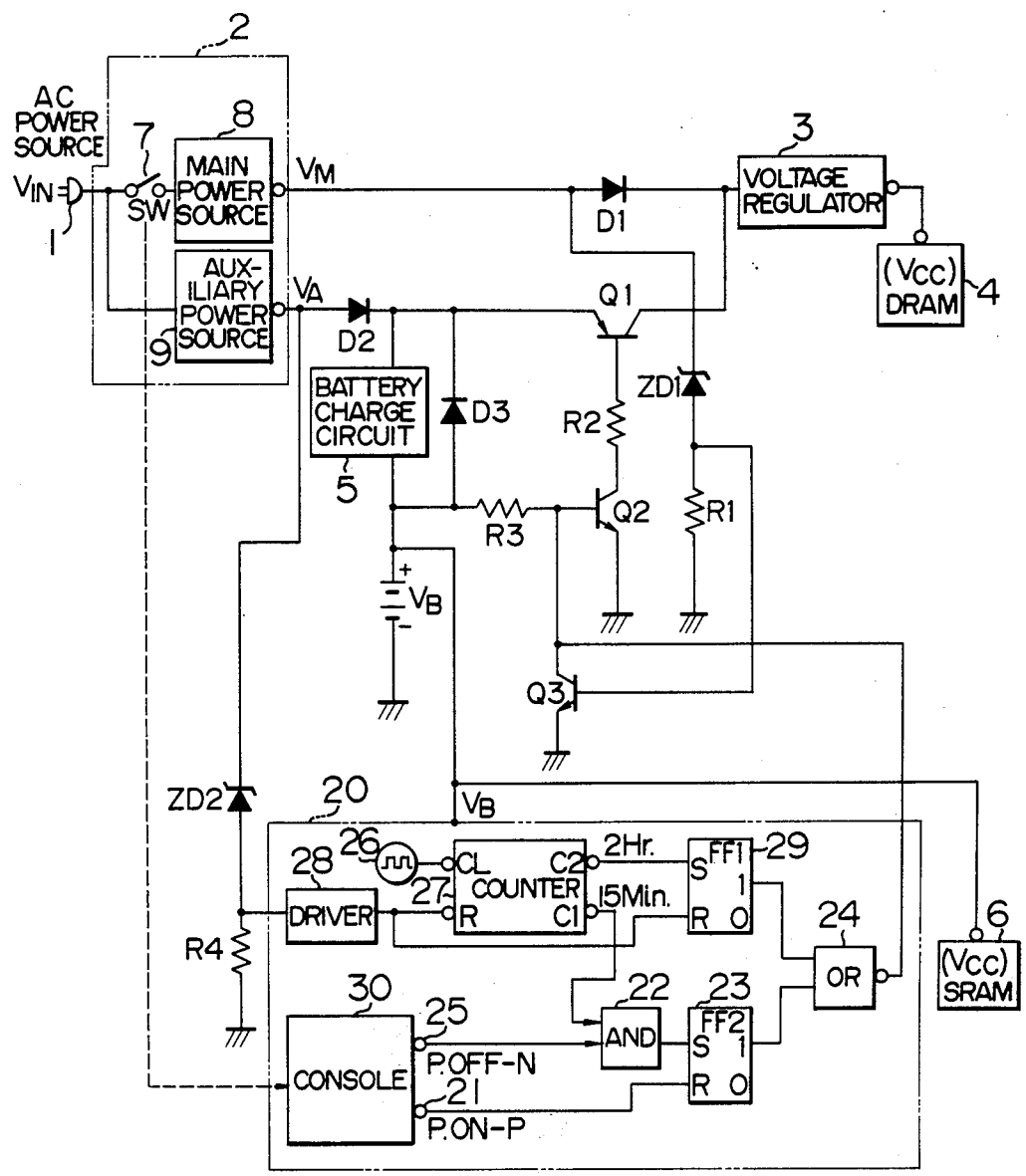
FIG. 1 is a schematic diagram of the power supply circuit embodying the present invention.

An embodiment of this invention will now be described with reference to FIG. 1. Only a power supply section and a memory section of a data processing system are illustrated in FIG. 1. In the figure, reference numeral 1 denotes a plug for receiving the external a.c. input power supply voltage Vin, and 2 denotes a power unit incorporating rectifiers for converting the a.c. input voltage into d.c. voltages. The power unit 2 includes a main power source 8 which provides a d.c. output $V_M$ when the switch 7 in the unit is set to "power-on" and an auxiliary power source 9 which provides an d.c. output $V_A$ even if the switch 7 is set to "power-off" so long as the a.c. power supply Vin is received. The main output power voltage $V_M$ is distributed to other control circuits (not shown) and all circuit sections of the data processing system can operate normally once the voltage $V_M$ builds up. The auxiliary power voltage $V_A$ is supplied to the dynamic random access memory (DRAM) when the power unit 2 is in the power-off state, and it is also used as a power source for controlling the power-on and power-off operations.

The main power output $V_M$ is fed through a diode D1 to a voltage regulator 3, which provides the stabilized power voltage to a DRAM 4. The main power output $V_M$ has a serial connection of a zener diode ZD1 and resistor R1 for detecting the rise and fall of the voltage.

The auxiliary power output $V_A$ is fed through a diode D2 to the emitter of a pnp transistor Q1, which has its collector connected to the input of the d.c. voltage regulator 3. The diode D2 has its cathode connected to a battery charging circuit 5, with a battery $V_B$ connected between the output of the charging circuit 5 and ground. The positive terminal of the battery is also connected through a diode D3 to the emitter of the transistor Q1. The transistor Q1 is driven in switching mode by being connected at its base through a resister R2 to an npn transistor Q2 which is biased through a resistor R3 by the battery $V_B$. The base of the transistor Q2 is connected to a pnp transistor Q3, which has its base connected to the anode of the zener diode ZD1 so that the transistor Q2 is cut off in response to the build-up of the main power output voltage $V_M$. To detect the presence or absence of the auxiliary power output voltage $V_A$, the output line is connected through a zener diode ZD2 to a resistor R4.

Reference numeral 20 denotes a CMOS logic circuit operating under the battery voltage and it produces an output signal for terminating the battery back-up for the DRAM 4 upon expiration of two hours, for example, in the case where the power failure has occurred during the power-on state, or for terminating the battery back-up upon expiration of 15 minutes, for example, in the case where the power failure has occurred during the power-off state.

Reference numeral 26 denotes a clock generator which supplies the clock signal to the CL terminal of a clock counter 27. The counter 27 is reset to the initial state by receiving at its R terminal the reset signal which is produced by a driver 28 in response to the detection of the build-up of the auxiliary power output voltage $V_A$ at the node of the zener diode ZD2 and resistor R4. The clock counter 27 further has output terminals C1 and C2 for providing output pulses when certain counts are reached. In this embodiment, the counter 27 is designed to produce an output pulse at C1 upon expiration of a shorter time length, e.g., 15 minutes, and another output pulse at C2 upon expiration of a longer time length, e.g., two hours. A flip-flop 29 is set by the C2 output of the clock counter 27 and is reset by the output of the driver 28.

A console 30 provides the P.OFF-N signal 25 indicating the power-off state, but the signal is not produced when the power unit 2 is deactivated without through the power-off operation as in the case of power failure. The P.OFF-N signal is fed to one input of a logical AND gate 22, which has another input connected to the C1 output of the clock counter 27. The AND gate 22 has its output connected to the set terminal of a flip-flop 23. The console 30 provides another output signal P.ON-P indicating the power-on state, and it is fed to the reset terminal of the flip-flop 23. A logical OR gate 24 has two inputs from the flip-flops 29 and 23, and supplies its output to the base of the transistor Q2 so that it is forced to cut off.

Reference numeral 6 denotes a static random access memory (SRAM) operating under the battery voltage $V_B$. The reason for the provision of the DRAM 4 which is battery backed-up for a limited time length and the SRAM 6 which is battery backed-up unlimitedly is as follows. The DRAM is larger in storage capacity, smaller in size and cheaper in bit price as compared with the SRAM. Accordingly, a large-capacity and compact memory can be realized by solely employing DRAM devices, but with a drawback of greater power dissipation which allows battery back-up for a shorter time length. On the other hand, the SRAM is higher in bit cost and thus disadvantageous for constructing a large-capacity memory, but it can hold information using extremely small power. On this account, this embodiment uses both of DRAM and SRAM, the former storing information which can be reloaded from a non-volatile memory (not shown) after battery back-up has terminated, while the latter storing information which cannot be recovered once battery back-up is suspended.

The DRAM is provided with the battery back-up for a limited duration in the occurrence of power failure so as to spare much battery power for the SRAM which is battery backed-up continuously so that information is retained. Information stored in the DRAM includes program preset data, and information stored in the SRAM includes input data received consecutively in the power-on state.

Figure 2:
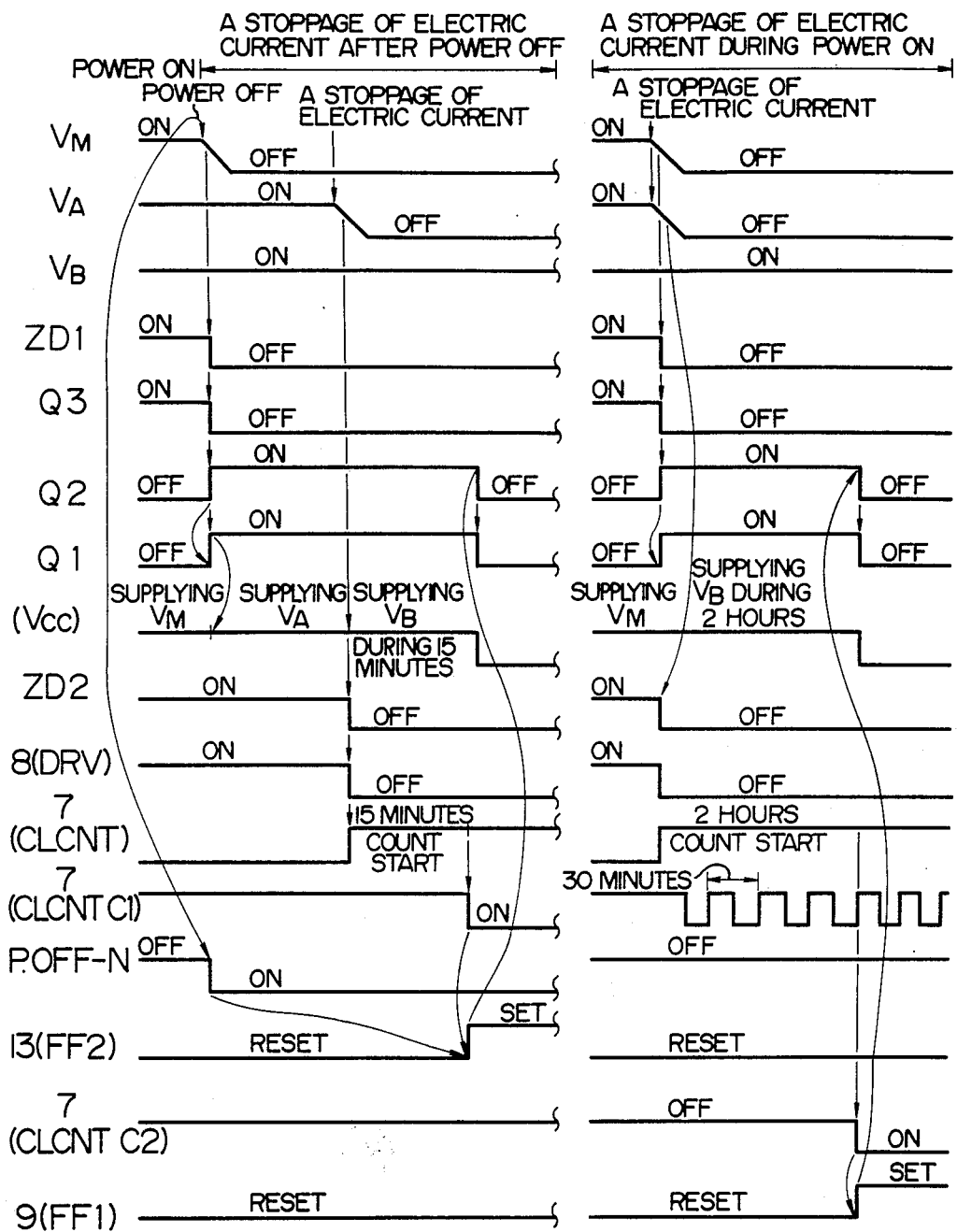
FIG. 2 is a timing chart explaining the operation of the circuit arrangement shown in FIG. 1.

Next, the operation of the foregoing circuit arrangement will be described in connection with FIG. 2 showing the timing relationship between the major signals.

As initial conditions, it is assumed that the battery $V_B$ is fully charged, the program is loaded in the DRAM 4, the power unit 2 is in the "power-on" state, and the flip-flops 29 and 23 are in the reset state. The d.c. output voltages are set to be $V_M \geq V_A \geq V_B$. The power unit 2 in the power-on state provides the main power output $V_M$ for the d.c. voltage regulator 3, which supplies the voltage Vcc to the DRAM. The main power output $V_M$ supplies a current through the zener diode ZD1 to the resistor R1, causing the transistor Q3 to become conductive, resulting in the cut-off of the transistors Q2 and Q1. Therefore, the auxiliary power output $V_A$ and battery $V_B$ are not loaded, and the DRAM 4 is powered by the main power output $V_M$ in the power-on state.

Next, when the power unit 2 is brought to the power-off state, the main power output $V_M$ falls, causing the zener diode ZD1 to be deactivated and then the transistor Q3 to be cut off. Consequently, the transistor Q2 becomes conductive and then the transistor Q1 also becomes conductive, causing the d.c. voltage regulator 3 to be supplied with the auxiliary power output $V_A$ which is lower than the main power output $V_M$, and a voltage enough to retain the memory contents is supplied to the DRAM 4.

In the case where power failure occurs in the a.c. power input Vin during the normal power-off state, the auxiliary power output $V_A$ goes off and the battery $V_B$ which has been charged by the battery charging circuit 5 becomes to supply power through the diode D3 to the d.c. voltage regulator 3, allowing the DRAM 4 to retain its contents.

The loss of the auxiliary power output $V_A$ due to power failure causes the zener diode ZD2 to be deactivated, and the output of the driver 28 releases the reset condition of the clock counter 27 and flip-flop 29. The clock counter 27 starts counting the clock signal from the clock generator 26, and if the main a.c. power does not recover in 15 minutes it produces the output signal on the terminal C1. Because of power failure after the normal power-off operation, the P.OFF-N signal produced in response to normal power-on is present on the terminal 25, and the AND gate 22 is enabled by the P.OFF-N signal and the output at C1 of clock counter 27 sets the flip-flop 23. The power-on indication signal P.ON-P 21 is absent at the reset terminal of the flip-flop 23 in the power-off state, and it is not reset. The set output at 1's terminal of the flip-flop 23 enables the OR gate 24 to bypass the base bias of the transistor Q2, causing it to become cut-off and then the transistor Q1 to become cut-off, and the back-up power supply from the battery $V_B$ is terminated. Accordingly, a 15-minute battery back-up takes place in the case of power failure in the normal power-off state.

If power failure occurs abruptly during the normal power-on state, the power-off indication signal P.OFF-N 25 is not produced, causing the AND gate 22 to stay disabled even if the clock counter 27 provides the output at C1 on expiration of 15 minutes, and the flip-flop 23 is not set. In the case of the main a.c. power not recovering on expiration of two hours, the clock counter 27 produces the output signal on its terminal C2, causing the flip-flop 29 to set, and the OR gate 24 is enabled. The OR gate output forces the transistor Q2 to cut off, resulting in the cut-off of the transistor Q1, and the battery back-up is terminated. Accordingly, a 2-hour battery back-up takes place for the a.c. power failure during the power-on state.

Generally, information in the volatile memory is saved in a non-volatile memory such as a floppy disc unit or fixed disc unit prior to the power-off operation. When the internal memory is powered by the auxiliary power source to retain the contents during the power-off state, the time spent for reloading the saved information following the power-on operation can effectively be minimized. The auxiliary power source for this purpose is preferably backed up by the battery so as to avoid the risk of power failure during the power-off state. However, a greater battery power consumption needs a longer charging time, and based on the fact that important data has been saved in the non-volatile memory before power failure occurs in the power-off state, the internal memory is battery backed-up for a relatively short time (15 minutes in this embodiment) so as to minimize the discharging of the battery. Namely, it cannot be distinguished during the power-off state as to whether the loss of a.c. power is caused by an accidental power failure, disconnection of the power plug, or turning-off of the a.c. power switch, and a shorter time is allowed for the battery back-up of these cases so that the battery power is spared for a long term power failure after power is turned on. On the other hand, power failure during the power-on state allows no time for saving the memory contents in the non-volatile memory, and therefore the internal memory is battery backed-up for a longer time (two hours in this embodiment) in expectation of a.c. power recovery.

According to this invention, the internal memory is supplied with power uninterruptedly irrespective of the a.c. power condition, and the battery is operated to discharge only in the event of accidental power failure for different time lengths depending on the operating condition of the apparatus, whereby the battery can be protected from over-discharging.

I claim:

1. A power supply circuit for supplying electrical power to an electronic apparatus having a memory device comprising: p1 (a) a main power unit connected to an external power source and said apparatus for supplying necessary power to said apparatus in response to the operation of a switching means;
   (b) an auxiliary power unit connected to said external power source and said apparatus for supplying power necessary for said memory device to retain stored information at least during an off-state of said main power unit;
   (c) a battery serving as a back-up of said auxiliary power unit and main power unit for supplying power to said memory device for retaining stored information;
   (d) detection means for detecting the output voltage of said auxiliary power unit; and
   (e) power shut-off means which cuts off the power supply from said auxiliary power unit to said memory device upon expiration of a predetermined time after said detection means has detected a falling voltage.

2. A power supply circuit according to claim 1, wherein said main power unit is connected to said external power source through said switching means.

3. A power supply circuit according to claim 1 further comprising voltage detection means for detecting the output voltage of said main power unit and a switch means for connecting said auxiliary power unit to said memory device in response to the detection of a falling voltage by said voltage detection means.

4. A power supply circuit according to claim 1, further comprising charging means for charging the output of said auxiliary power unit to said battery and a current unidirectional means connected between the output of said auxiliary power unit and said battery.

5. A power supply circuit according to claim 4, wherein said auxiliary power unit provides an output voltage which is higher than or equal to the output voltage of said battery.

6. A power supply circuit according to claim 1, wherein said power shut-off means comprises means which cuts off the power supply from said battery upon expiration of a first time length if said detection means has detected a falling voltage during a halt state of said apparatus, or cuts off the power supply from said battery upon expiration of a second time length longer than said first time length if said detection means has detected a falling voltage during an operating state of said apparatus.

7. A power supply circuit according to claim 1, wherein said memory device comprises a dynamic random access memory 8. A power supply circuit according to claim 7, wherein said apparatus further comprises a static random access memory which is connected to said battery so as to receive power uninterruptedly.

* * * * *